United States Patent
Joo

(10) Patent No.: US 10,558,108 B2
(45) Date of Patent: Feb. 11, 2020

(54) CAMERA MODULE

(71) Applicant: LG INNOTEK CO., LTD., Seoul (KR)

(72) Inventor: Young Sang Joo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/744,735

(22) PCT Filed: Jul. 15, 2016

(86) PCT No.: PCT/KR2016/007706
§ 371 (c)(1),
(2) Date: Jan. 12, 2018

(87) PCT Pub. No.: WO2017/010834
PCT Pub. Date: Jan. 19, 2017

(65) Prior Publication Data
US 2018/0224716 A1 Aug. 9, 2018

(30) Foreign Application Priority Data

Jul. 15, 2015 (KR) .................. 10-2015-0100497

(51) Int. Cl.
*G03B 17/02* (2006.01)
*H05K 1/02* (2006.01)
(Continued)

(52) U.S. Cl.
CPC ............ *G03B 17/02* (2013.01); *H05K 1/028* (2013.01); *H05K 1/0271* (2013.01); *H05K 1/142* (2013.01);
(Continued)

(58) Field of Classification Search
None
See application file for complete search history.

(56) References Cited

U.S. PATENT DOCUMENTS 8,275,255 B2 * 9/2012 Iwasaki .................. G03B 17/00
396/349
9,513,458 B1 * 12/2016 Flugge .................... G02B 7/04
(Continued)

FOREIGN PATENT DOCUMENTS

JP 8-136990 A 5/1996
JP 2004-187202 A 7/2004
(Continued)

*Primary Examiner* — Clayton E. LaBalle
*Assistant Examiner* — Linda B Smith
(74) *Attorney, Agent, or Firm* — Birch, Stewart, Kolasch & Birch, LLP

(57) ABSTRACT

A camera module including a lens part; a lens holder supporting the lens part while surrounding the same; a PCB assembly processing light input through the lens part into an electrical signal; and a shield can having an internal space in which the PCB assembly is disposed, wherein the PCB assembly includes a plurality of PCBs having circuits mounted thereon; and a flexible connecting part electrically connecting the plurality of PCBs and including a conductive layer in which a conductive material is disposed, and the shield can has an avoidance part formed in a position corresponding to the connecting part.

20 Claims, 8 Drawing Sheets

(51) Int. Cl.
*H05K 1/14* (2006.01)
*H05K 1/18* (2006.01)
*H05K 9/00* (2006.01)

(52) U.S. Cl.
CPC ........... H05K 1/181 (2013.01); H05K 9/0024 (2013.01); *H05K 2201/10121* (2013.01); *H05K 2201/10151* (2013.01); *H05K 2201/10371* (2013.01)

(56) References Cited

U.S. PATENT DOCUMENTS

| | | | |
|---|---|---|---|
| 9,746,636 B2* | 8/2017 | Flugge | G02B 7/08 |
| 2007/0287314 A1* | 12/2007 | Ma | H01R 13/6594 |
| | | | 439/188 |
| 2011/0068174 A1* | 3/2011 | Miyoshi | G06K 7/10722 |
| | | | 235/462.11 |
| 2011/0279675 A1* | 11/2011 | Mano | G02B 13/001 |
| | | | 348/148 |
| 2011/0304015 A1* | 12/2011 | Kim | H01L 23/552 |
| | | | 257/532 |
| 2012/0025924 A1* | 2/2012 | Yamauchi | H05K 1/0245 |
| | | | 333/4 |
| 2015/0234495 A1* | 8/2015 | Lo | G06F 3/0416 |
| | | | 345/174 |

FOREIGN PATENT DOCUMENTS

| | | |
|---|---|---|
| KR | 10-0723149 B1 | 5/2007 |
| KR | 10-0790681 B1 | 1/2008 |
| KR | 10-0959862 B1 | 5/2010 |

* cited by examiner

CAMERA MODULE

CROSS REFERENCE TO RELATED APPLICATIONS

This application is the National Phase of PCT International Application No. PCT/KR2016/007706, filed on Jul. 15, 2016, which claims priority under 35 U.S.C. 119(a) to Patent Application No. 10-2015-0100497, filed in the Republic of Korea on Jul. 15, 2015, all of which are hereby expressly incorporated by reference into the present application.

TECHNICAL FIELD

The teachings in accordance with exemplary and non-limiting embodiments of this invention relate generally to a camera module, and more particularly to a camera module using a substrate assembly of a rigid PCB.

BACKGROUND ART

In general, a PCB (Printed Circuit Board) is to connect or support various parts in response to circuit design of electric wiring, and concomitant with recent trend of miniaturized size of electronic products, a PCB capable of mounting parts in a high density is on demand. In response to this requirement, various types of PCBs are being developed, and one of these is a rigid PCB capable of being three-dimensionally and spatially deformable. The rigid PCB requires a high bendability at a flexible part or a flexible area.

However, the flexible area of the rigid PCB receives a continued bending force, and is printed with a conductive material to thereby provide an influence in bending, whereby damage such as cracks and tearing is frequently generated to result in generation of detective products.

Furthermore, when a substrate assembly is formed with the rigid PCB in a shield can protecting the substrate assembly by accommodating the substrate assembly in a camera module, an interference at a connection part of a substrate forming the substrate may be disadvantageously generated due to bending at the flexible area when the substrate assembly is arranged.

DETAILED DESCRIPTION OF THE INVENTION

Technical Subject

The present invention is to solve the abovementioned problems/disadvantages, and it is an object of the present invention to provide a substrate assembly configured to prevent cracks or tearing even if a bending force is received by the flexible PCB being flexed, by forming a pattern on a conductive layer of the flexible PCB, and a camera module using the same.

Technical Solution

In one general aspect of the present invention, there is provided a camera module, the camera module comprising:
a lens part;
a lens holder supporting the lens part while surrounding the same;
a PCB assembly processing light input through the lens part into an electrical signal; and
a shield can having an internal space in which the PCB assembly is disposed,
wherein
the PCB assembly comprises:
a plurality of PCBs having circuits mounted thereon; and
a flexible connecting part electrically connecting the plurality of PCBs and comprising a conductive layer in which a conductive material is disposed, and the shield can has an avoidance part formed in a position corresponding to the connecting part.

Preferably, but not necessarily, each of the plurality of PCBs may include a first layer and a fourth layer mounted with parts, a second layer disposed between the first and fourth layers and printed with conductive material, and a third layer disposed between the second layer and the fourth layer including a circuit for transmitting an electrical signal, wherein the conductive layer of the connecting part is mutually conductive by being extended from the second layer of any one PCB and the second layer of an adjacent PCB thereof.

Preferably, but not necessarily, the conductive material in the conductive layer of the connecting part may be formed in a mesh structure.

Preferably, but not necessarily, the connecting part may connect between substrates, and may further include a signal connecting layer printed with a circuit for mutual conductivity by being extended from the third layer of one substrate and the third layer of an adjacent substrate thereof.

Preferably, but not necessarily, a width of each conductive material forming the conductive layer may be 55 μm to 165 μm.

Preferably, but not necessarily, the conductive layer may be such that a straight distance between nearest parallel conductive layers is 350 μm to 450 μm.

Preferably, but not necessarily, the conductive layer may further include a conductive wire electrically connecting any one substrate and a substrate adjacent thereof.

Preferably, but not necessarily, the avoidance part of the shield can may avoid interference with the connecting part of the substrate assembly.

Preferably, but not necessarily, the plurality of substrates may include a first substrate mounted at one surface with an image sensor converting a light incident from the lens part to an electrical signal, a third substrate receiving a power from an outside, and a second substrate interposed between the first substrate and the third substrate, wherein the connecting part may include a first connecting part electrically connecting the first substrate and the third substrate, and a second connecting part electrically connecting the second substrate and the third substrate, and wherein the shield can may include a first side opposite to one surface of the first connecting part, and a second side opposite to one surface of the second connecting part.

Preferably, but not necessarily, the first side may be disposed between an imaginary plane including an upper surface of the second substrate and an imaginary plane including a bottom surface of the third substrate, and the second side may be disposed between an imaginary plane including an upper surface of the first substrate and an imaginary plane including a bottom surface of the second substrate.

Preferably, but not necessarily, the first side may be such that a nearest distance with an imaginary plane including an upper surface of the second substrate is shorter than the nearest distance with an imaginary plane including a bottom surface of the third substrate, and the second side may be such that a nearest distance with an imaginary plane including a bottom surface of the second substrate is shorter than a nearest distance with an imaginary plane including an upper surface of the first substrate.

Preferably, but not necessarily, a distance between the first side and the first connecting part and a distance between the second side and the second connecting part may satisfy a scope greater than 0.1 mm but smaller than 0.9 mm.

Preferably, but not necessarily, the substrate assembly may be supported to the shield can by a support member.

Preferably, but not necessarily, the support member may be provided in a plural number, each being formed with an insertion groove, and one end of any one support member may be inserted into the insertion groove formed at the other end of the other support member.

Preferably, but not necessarily, the support member may include, at the other end, a plurality of grooves formed by being spaced apart by a predetermined distance along a circumferential direction.

Preferably, but not necessarily, an outer circumferential surface of one end of any one support member may be screw-connected to an inner circumferential surface of an insertion groove formed at the other end of the other support member using mutually corresponding screw threads.

Preferably, but not necessarily, the camera module may further comprise a rear body forming an inner space by being coupled to the lens holder, wherein the shield can may further include, at an outer surface, an elastic part.

Advantageous Effects

According to the present invention, a pattern is formed on a conductive layer of a flexible printed circuit board so that it is possible to prevent cracks and tearing and to reduce a defect in the product at the same time even though the flexible printed circuit board is bent and subjected to a bending force, thereby enhancing the reliability of the product.

Furthermore, according to the present invention, an avoidance part is provided at the shield can to avoid interference between a connecting part bending along a substrate arrangement shape of substrate assembly and the shield can to thereby prevent an erroneous operation and damage/deformation of the connecting part.

BEST MODE

Figure 1:
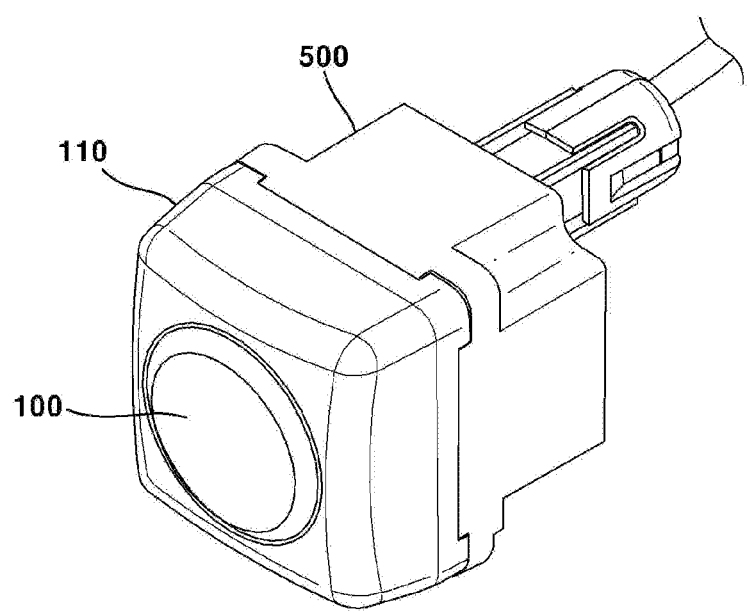
FIG. 1 is perspective view illustrating a camera module according to an exemplary embodiment of the present invention.

Some of the exemplary embodiments of the present invention will be described with the accompanying drawings. Detailed descriptions of well-known functions, configurations or constructions are omitted for brevity and clarity so as not to obscure the description of the present disclosure with unnecessary detail. Furthermore, throughout the descriptions, the same reference numerals will be assigned to the same elements in the explanations of the figures.

Furthermore, the terms "first," "second," "A", "B", (a), (b) and the like, herein do not denote any order, quantity, or importance, but rather are used to distinguish one element from another. In the following description and/or claims, the terms coupled and/or connected, along with their derivatives, may be used. In particular embodiments, connected may be used to indicate that two or more elements are in direct physical and/or electrical contact with each other. "Coupled" may mean that two or more elements are in direct physical and/or electrical contact. However, coupled may also mean that two or more elements may not be in direct contact with each other, but yet may still cooperate and/or interact with each other. For example, "coupled", "joined" and "connected" may mean that two or more elements do not contact each other but are indirectly joined together via another element or intermediate elements. Furthermore, a substrate and a PCB may be interchangeably used throughout the following explanation.

Now, a camera module according to an exemplary embodiment of the present invention will be described with reference to the accompanying drawings.

Figure 2:
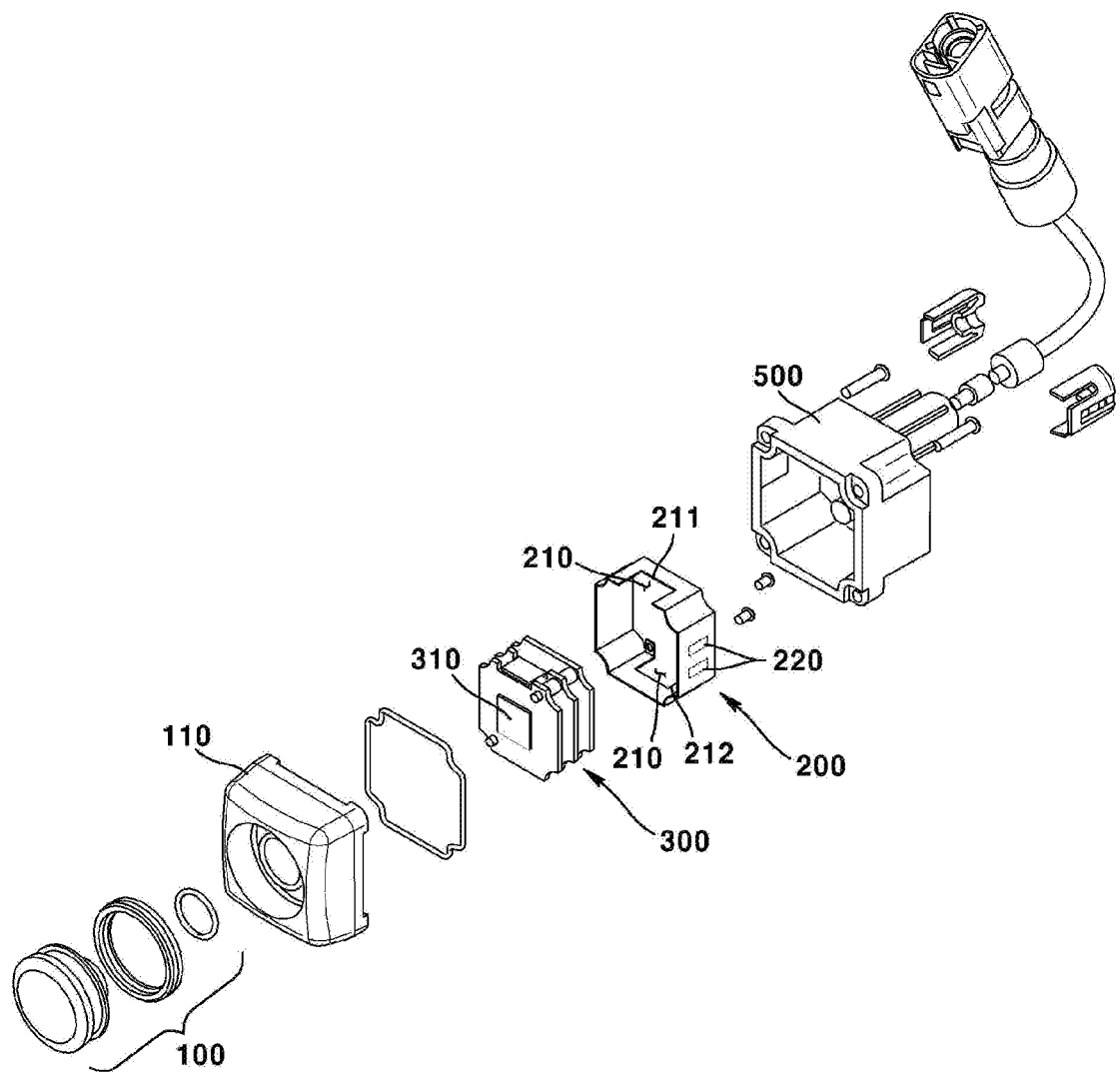
FIG. 2 is an exploded perspective view illustrating a camera module according to an exemplary embodiment of the present invention.

FIG. 1 is perspective view illustrating a camera module according to an exemplary embodiment of the present invention, and FIG. 2 is an exploded perspective view illustrating a camera module according to an exemplary embodiment of the present invention.

Referring to FIGS. 1 and 2, the camera module according to an exemplary embodiment of the present invention may include a lens part (100), a shield can (200) and a substrate assembly (300).

The lens part (100) may include at least one lens (no reference numeral) and a lens holder (110) fixing the lens by being coupled to the lens. The lens holder (110) may form an inner space by being coupled to a rear body (500, described later). The shield can (200) may be arranged at an inner space formed by the lens holder (110) and the read body (500), and the shield can (200) may form an inner space at an inner lateral side by being covered by the lens holder (110) and the rear body (500), and the a substrate assembly (described later, 300) may be arranged at an inner lateral space of the shield can (500).

The shield can (500) may be formed at an outer surface with an elastic part (220) to protect the camera module from an external force such as vibration whereby durability can be enhanced. The present invention has not particularly limited to use of elastic part (220) as long as it has elasticity. For example, the elastic part (210) may be formed with material having elasticity such as rubber or urethane, may be structurally formed in a shape of an elastic piece having elasticity, and may have various shapes, structures and positions according to a manufacturer's desire.

Figure 3:
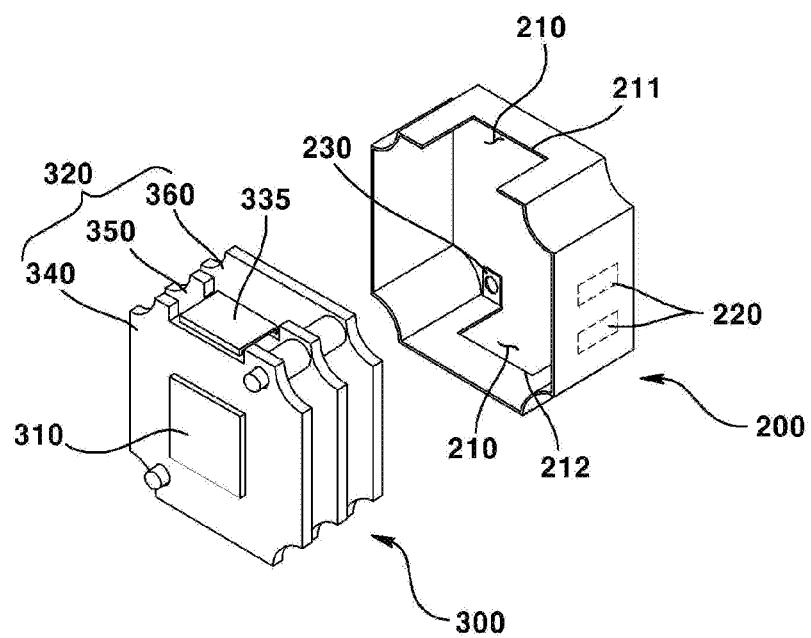
FIG. 3 is a schematic view illustrating a substrate assembly and a shield can of a camera module according to an exemplary embodiment of the present invention.

FIG. 3 is a schematic view illustrating a substrate assembly (300) and a shield can (200) of a camera module according to an exemplary embodiment of the present invention.

Referring to FIGS. 2 and 3, the substrate assembly (300) may be arranged at an inner space of the shield can (200). The substrate assembly (300) according to an exemplary embodiment of the present invention is a rigid PCB, and may be folded by being bent at the connecting part (330, described later) while being arranged at an inner space of the shield can (200). That is, the substrate assembly (300) may include a plurality of substrates (320) and a flexible connecting part (330) connecting the plurality of substrates (320), such that the connecting part (330) can be bent to allow one surface of the plurality of substrates (320) to face one surface of neighboring substrate (320), whereby the substrate assembly (300) may be formed with a plurality of substrates (320) in a multiple stairs to be arranged in the inner space of the shield can (200). Although it is preferable that the plural substrates (320) in the multiple stairs are parallel formed, the present invention is not limited thereto. In addition, an avoidance part (210) corresponding to the connecting part (330) may be formed at one side of the shield can (200) in order to avoid interference of the shield can (200) with the connecting part (330). At this time, the avoidance part (210) may be formed by cutting any portion of the shield can (200), and the shield can (200) may be formed in a cast to allow forming the avoidance part (210). Furthermore, although the avoidance part (210) is illustrated in a square shape in the drawing, the avoidance part (210) may be formed in a round shape or a polygonal shape depending on a manufacturer's intention. It is also preferable that the avoidance part (210) be formed on the shield can (200) in consideration of position, size and the number thereof, depending on the position, the number and shape of the connecting part (330) connecting the substrate (320) of the substrate assembly (300).

For example, referring to FIGS. 2 and 3, when each substrate is called a first substrate (340), a second substrate (350) and a third substrate (360) along an optical axis for a substrate assembly including three (3) plurality of substrates (320), an avoidance part (210) corresponding to a first connecting part (335) connecting the first substrate (340) and the second substrate (350) may be formed on any one surface of the shield can (200) while being formed near to the lens part (100), and an avoidance part (210) corresponding to a second connecting part (336) connecting the second substrate (350) and the third substrate (360) may be formed on the other surface opposite to any one surface of the shield can (200) while being formed near to a read body (500).

For reference, the bent connecting part (330), that is, each of the first connecting part (335) and the second connecting part (336), may be protrusively arranged toward an outside of the shield can (200) by passing through the avoidance part (210) of the shield can (200). Furthermore, in order to avoid interference of the shield can (200) with the connecting part (330), the avoidance part (210) may be provided on the shield can (200), this is just an example, and even if the avoidance part (210) is provided, the shield can (200) and the connecting part (330) may be mutually abutted together due to an assembly tolerance.

It is preferable that a distance between a straight line part (no reference numeral) formed by a border between the second substrate (350) and the connecting part (330) and one side of the shield can (200) may be maintained greater than 0.1 mm but shorter than 0.9 mm, and a preferable distance may be 0.4 mm.

Meantime, it is possible to arrange the substrates (320) lest they be arranged in parallel manner, and as a result, the connecting part (330) can be bent, and the avoidance part (210) of the shield can (200) can be also provided in a like manner thereto depending on the positions of the connecting part (330). For example, albeit not illustrated in the drawings, when seen from a lateral surface, the substrates (320) may be arranged in a "⊏" shape, and when an apex where the above "⊏" is bent is arranged with the connecting part (330), the avoidance part (210) may be formed at any one corner of the shield can (200) and at the other corner of the shield can (200) sharing a surface of the one corner and formed in parallel therewith. In addition, when the substrates are seen from a plane surface, and when the substrates (320) are arranged at a "¬" shaped apex, and the connecting part (330) is arranged at a "¬" shaped side of the apex, the avoidance part (210) of the shield can (200) may be formed at any one surface of the shield can (200) and may be formed at a neighboring surface thereof, and the position of the avoidance part (210) may be variably selected depending on the manufacturer's intent.

The substrate assembly (300) may further include an image sensor (310) in order to convert a light incident from the lens part (100) to an electrical signal. Furthermore, the plurality of substrates (320) may be mounted with a circuit, and the connecting part (330) may electrically connect the plurality of substrates (320). That is, the connecting part (330) may include a conductive layer (331), where the conductive layer (331) may be arranged with a mesh structure or a net structure in conductive material to allow conductivity.

Figure 4:
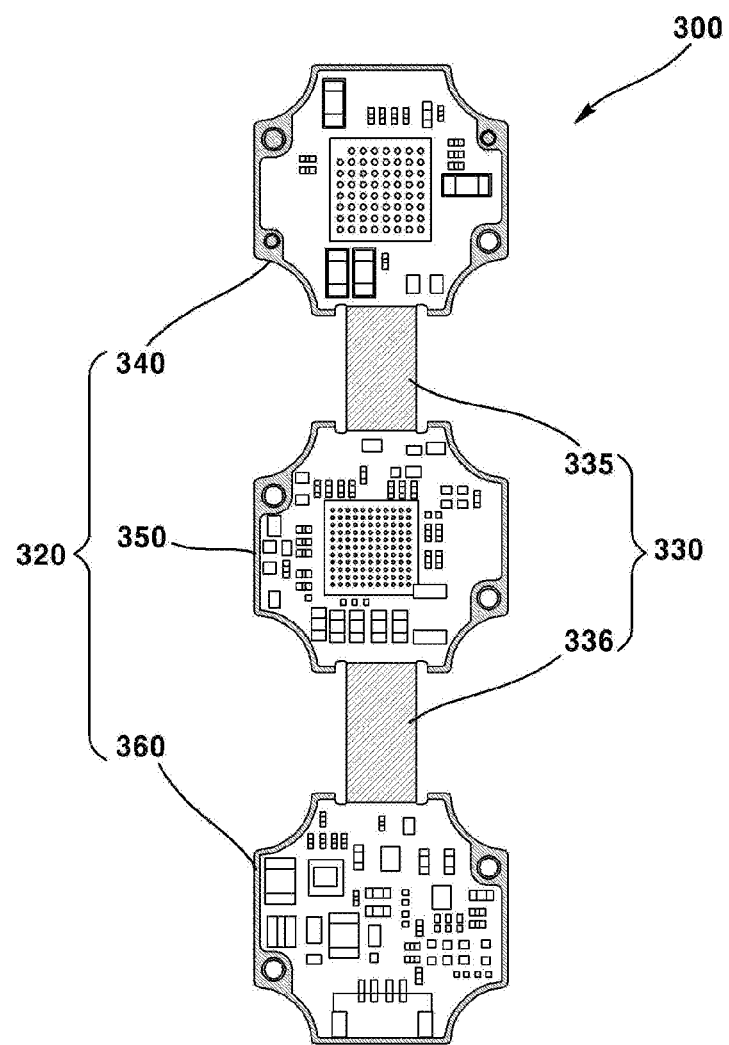
FIG. 4 is a plane view illustrating a substrate assembly according to an exemplary embodiment of the present invention.

FIG. 4 is a plane view illustrating a substrate assembly (300) according to an exemplary embodiment of the present invention, where each surface shown in FIG. 4 is an upper surface of each substrate (340, 350, 360).

As discussed in the foregoing, and as illustrated in FIGS. 3 and 4, the substrate assembly (300) may include a plurality of substrates (320) and a connecting part (330) connecting the plurality of substrates (320). That is, the plurality of substrates (320) may include a first substrate (340), a second substrate (350) and a third substrate (360), and the connecting part (330) may include a first connecting part (335) connecting the first substrate (340) and the second substrate (350), and a second connecting part (336) connecting the second substrate (350) and the third substrate (360).

The first substrate (340) may include, at one surface, an image sensor (310) in order to convert a light incident from the lens part (100) to an electrical signal. The second substrate (350) may receive a power from an outside. The second substrate (350) may be interposed between the first substrate (340) and the third substrate (360) to electrically connect the first substrate (340) and the third substrate (360). In this case, the shield can (200) may be provided with an avoidance part (210), and the avoidance part (210) paralleling the first connecting part (335) may include a first side (211) where the first side (211) may face one surface of the first connecting part (335), and the avoidance part (210) facing the second connecting part (336) may include a second side (212) where the second side (212) may face one surface of the second connecting part (336).

The first side (211) may be interposed between an imaginary plane including an upper surface of the second substrate (350) and an imaginary plane including a bottom surface of the third substrate (360), and the second side (212) may be interposed between an imaginary plane including an upper surface of the first substrate (340) and a bottom surface of the second substrate (350).

At this time, the first side (211) may be such that a nearest distance from the imaginary plane including the upper surface of the second substrate (350) is positioned shorter than a nearest distance from the imaginary plane including the bottom surface of the third substrate (360), and the second side (212) may be such that a nearest distance from the imaginary plane including the bottom surface of the second substrate (350) is positioned longer than a nearest distance from the imaginary plane including the upper surface of the first substrate (340).

Meantime, the nearest distance between the first side (211) and the first connecting part (335) and a nearest distance between the second side (212) and the second connecting part (336) may preferably satisfy a scope of being greater than 0.1 mm, but of being shorter than 0.9 mm.

As discussed above, the first side (211) and the second side (212), and the first to third substrates (340, 350, 360) may be mutually arranged unparalleled due to work tolerance, and any arrangement may be acceptable as long as there is no interference between the connecting part (330) and the first side (211) or the second side (212).

Although it is illustrated in the drawing that the number of substrates (320) is three (3) and the number of connecting parts (330) is two (2), the number of substrates and the connecting parts may be variably changed depending on a user's selection.

Figure 5:
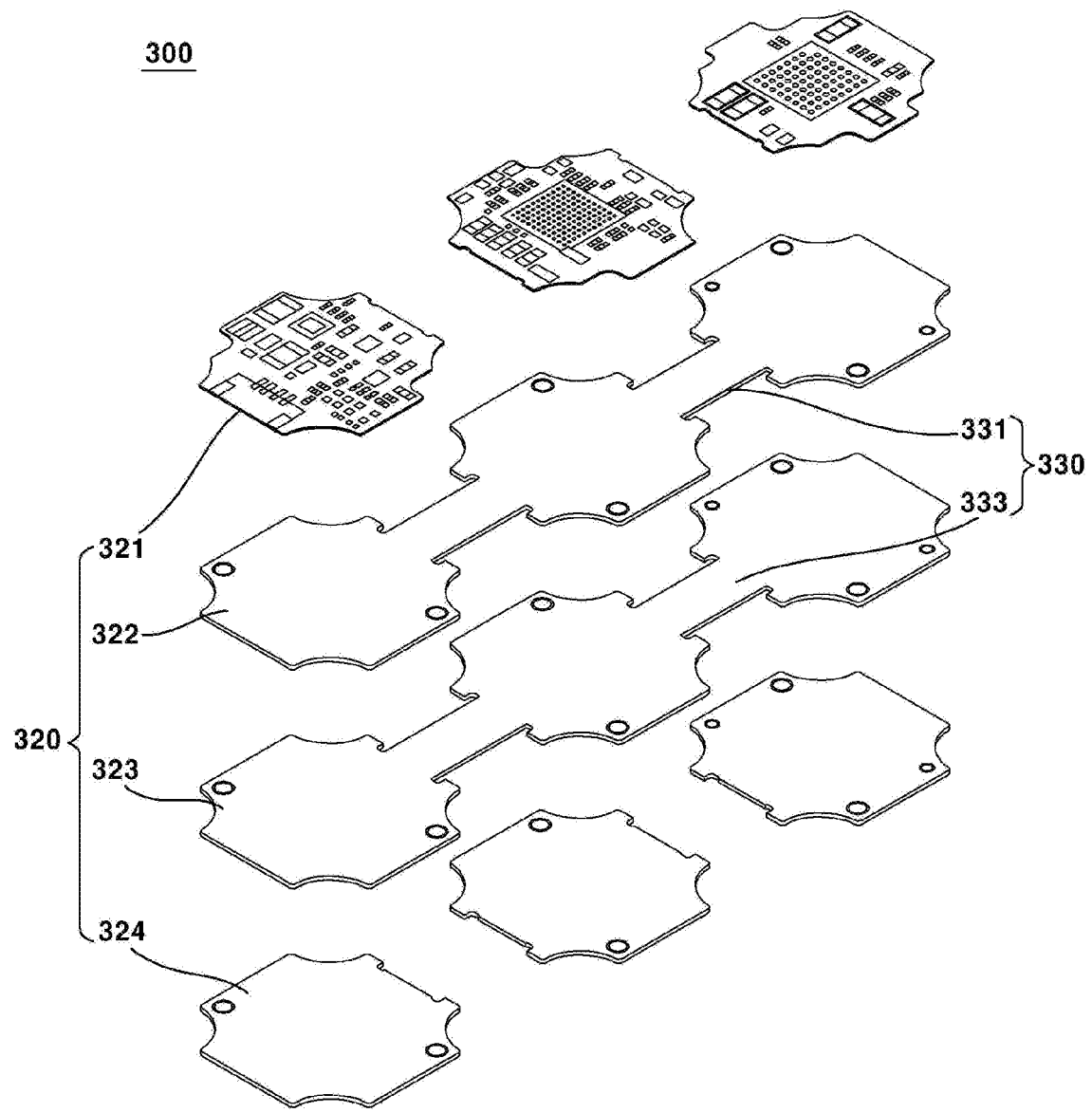
FIG. 5 is a schematic exploded perspective view illustrating a substrate assembly according to an exemplary embodiment of the present invention.

FIG. 5 is a schematic exploded perspective view illustrating a substrate assembly (300) according to an exemplary embodiment of the present invention.

Referring to FIG. 5, the substrate assembly (300) according to the exemplary embodiment of the present invention may use a 4-2-4 structured substrate, and each of the plurality of substrates (320) may include a first layer (321) to fourth layer (324). As illustrated in FIG. 5, each of the plurality of substrates (320) may be sequentially stacked in the order of first, second, third and fourth layers (321-324). Meantime, a configuration of dielectric material or insulation material may be further included between or among the plurality of substrates (320) depending on a manufacture's intention, which is, however, an example of the present invention, and the substrate assembly (300) may be used with variably structured substrates such as a 6-2-6 structured substrate and the like.

The first layer (321) and the fourth layer (324) are substrates forming an external look of the substrate (320) and may be mounted with parts. Furthermore, each of the first layer (321) and the fourth layer (324) may be preferably of rigid PCB. Meantime, the second layer (322) and the fourth layer (323) may be disposed between the first layer (321) and the fourth layer (324). The second layer (322) may include a conductive layer (331) printed with a conductive material, and the third layer (323) may include a signal connecting layer (333) printed with a circuit in order to transmit an electrical signal to any one substrate (320) and a substrate (320) adjacent thereof. Furthermore, the second layer (322) and the third layer (323) may be preferably formed with a flexible PCB to allow an easy flexibility. In addition, the second layer (322) and the third layer (323) may form in the connecting part (330) by being extensively formed and stacked at an area where the plurality of substrates (320) is electrically connected.

Figure 6:
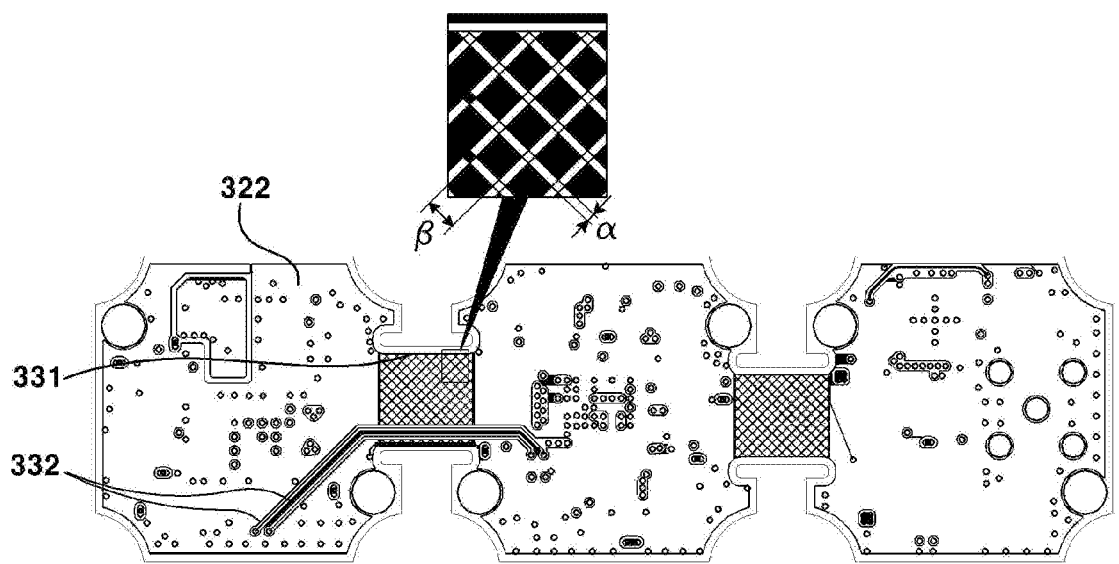
FIG. 6 is a schematic plane view illustrating a second layer of a substrate assembly according to an exemplary embodiment of the present invention.
Figure 7:
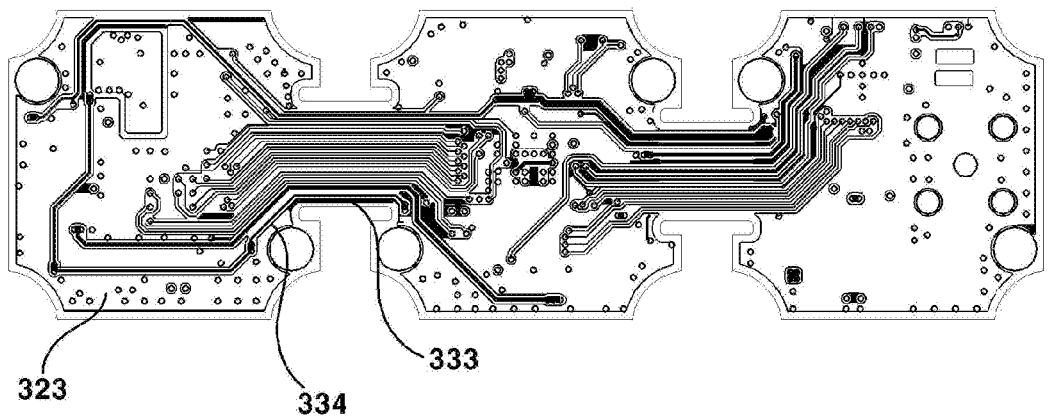
FIG. 7 is a schematic plane view illustrating a third layer of a substrate assembly according to an exemplary embodiment of the present invention.

FIG. 6 is a schematic plane view illustrating a second layer of a substrate assembly (300) according to an exemplary embodiment of the present invention, and FIG. 7 is a schematic plane view illustrating a third layer of a substrate assembly according to an exemplary embodiment of the present invention.

Referring to FIG. 6, the second layer (322) may form a conductive layer (331) by allowing the plurality of substrates (320) corresponding to the second layer (322) and the connecting part (330) to be printed with conductive material. The conductive layer (331) at the connecting part (330) of the second layer (322) may be formed in a mesh structure or a net structure at the conductive material to thereby reduce shocks from a restoring force at the connecting part when the connecting part (330) is bent, a flexing force and other forces applied to the connecting part by being generated from an external or internal areas, and to preclude or prevent in advance the damage to the connecting part (330).

The conductive material may be preferably a copper. However, the conductive material may be of any material that has conductivity depending on a user's intention. A preferable width ($\alpha$) of each conductive material forming the conductive layer (331) may be 55 µm to 165 µm (most preferable of 100 µm). Furthermore, the conductive layer (331) may be such that a preferable distance ($\beta$) between the nearest parallel conductive materials is 350 µm to 450 µm.

The second layer (322) functions to perform a ground of the substrate assembly (300), where a power is turned on to allow a current to be supplied to parts of the first to fourth layers (321-324) of the substrate (320) through a connector (no reference numeral), and to be transmitted to an adjacent substrate (320) through the third layer (323), and where the current is in turn transmitted to the connector through the second layer (322) to allow the second layer (322) to form a part of a circulating loop of the current.

Referring to FIG. 7, the third layer (323) may include a signal connecting layer (333) printed with a circuit in order to transmit an electrical signal to any one substrate (320) and a substrate (320) adjacent thereof. The circuit of the signal connecting layer (333) may be formed with a signal connecting wire (334) to allow a plurality of substrates (320) to be mutually conductive. For example, parts mounted on the first layer (321) of the fourth layer (324) may be electrically connected to the signal connecting wire (334) of the signal connecting layer (333) of the third layer (323) through a circuit printed on the first layer (321) or on the fourth layer (324) and a via hole.

Referring to FIG. 6 again, the conductive layer (331) of the second layer (322) may be provided with a conductive wire (332) for electrical connection with any one substrate (320) and a substrate (320) adjacent thereof, and the conductive wire (332) may be used when it is difficult for the signal connecting wire (334) to connect an electrical signal to the substrates (320).

That is, the conductive layer (331) of connecting part (330) or the second layer (322) may be formed at each one surface only in a mesh structure or a net structure of conductive material (see connecting part at right in FIG. 6), and in this case, conductivity can be possible through the conductive material, and an electrical connection is also possible between the substrates (320). Furthermore, the connecting part (330) or a conductive layer (331) of second layer (322) may be formed at each one surface in a mesh structure or a net structure and conductive wire at the same time (see connecting part at left in FIG. 6). Albeit not being illustrated in the drawing, only a portion of each one surface of the connecting part (330) or the conductive layer (331) of second layer (322) may be formed in a mesh structure or a net structure and the other remaining portion may be formed with a conductive wire (332) in a pattern to electrically connect the substrates (320). For example, the conductive material in each one surface of the connecting part (330) or the conductive layer (331) of second layer (322) may be formed in a conductive material in a mesh structure or a net structure and the remaining portion is formed at the conductive wire (332) with a pattern such as a mesh structure to allow functioning as a conductive wire (332). Apart from the above configurations, patterns of conductive wire (332) may be variably selected depending on a manufacturer's intent.

Figure 8:
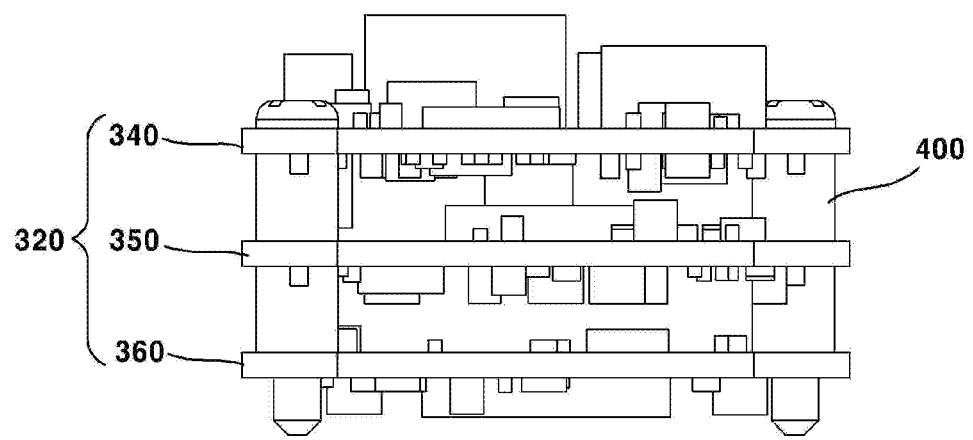
FIG. 8 is schematic view illustrating an assembled shape of a substrate assembly according to an exemplary embodiment of the present invention.

FIG. 8 is schematic view illustrating an assembled shape of a substrate assembly (300) according to an exemplary embodiment of the present invention.

Referring to FIG. 8, the substrate assembly (300) may be fixed to the shield can (200) by the support member (400) by being supported to the shield can (200) when being accommodated into the shield can (200). In other words, the plurality of substrates (320) at the substrate assembly (300) may be formed with a through hole (no reference numeral) passed by the support member (400), and the plural number of substrates (320) are supported to the shield can (200) and fixed not to be moved, and the image sensor (310) mounted with the substrates (320) may be arranged perpendicular to the optical axis to prevent an incident light from being twisted, and shake of optical axis may be prevented from an outside shock or interference of other elements with the substrates (320) may be also prevented. At this time, the shield can (200) may be inwardly bent from outer surface, and provided with a fragmental piece (230) formed with a through hole (no reference numeral) to allow the support member (400) to pass therethrough, whereby the substrate assembly (300) can be fixed along with the shield can (200). Meantime, although the third substrate (360) and the shield can (200) may be mutually fixed by the support member (400), the third substrate (360) and the shield can (200) may be fixed by being coupled with the support member (400) while being provided with a separate nut and bolt to allow passing through the fragmental piece (230) and the through hole of the third substrate (360).

Figure 9:
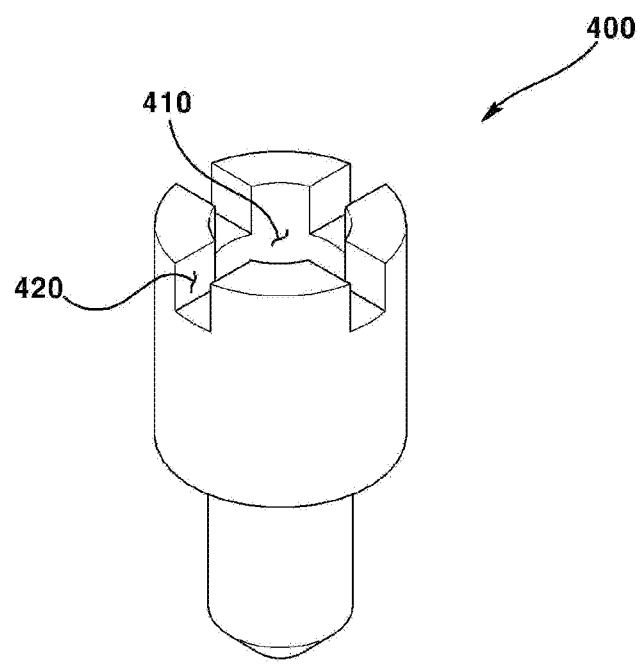
FIG. 9 is a schematic view illustrating a support member fixing the other substrate assembly according to an exemplary embodiment of the present invention.
Figure 10:
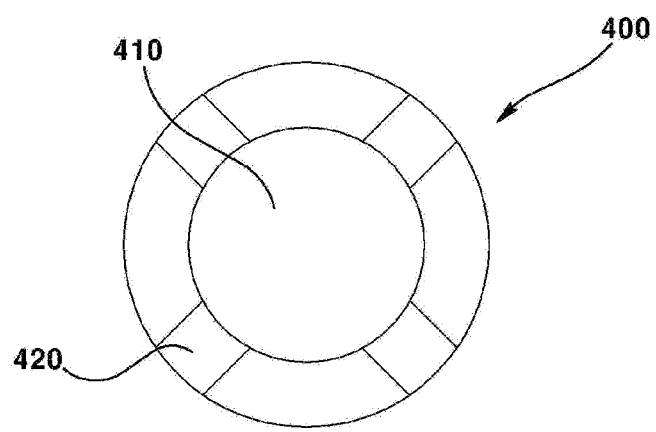
FIG. 10 is a schematic plane view illustrating a support member fixing the other substrate assembly according to an exemplary embodiment of the present invention.

FIG. 9 is a schematic view illustrating a support member (400) fixing the other substrate assembly (300) according to an exemplary embodiment of the present invention.

Referring to FIG. 9, the support member (400) may be fixed by allowing any one support member (400) to be inserted into any other support member (400). That is, the support member (400) may be provided in a plural number, where each support member (400) is such that one end of any one support member (400) is more narrowly formed than the other end to allow being inserted into the other end of the other support member (400), and the other end of the support member (400) is formed with an insertion groove (410) parallel to the size of the one end to allow one end of the other support member (400) being inserted for fixation.

At this time, the support member (400) may be formed with mutually corresponding screw threads (not shown) at an outer circumferential surface at one end and at an inner circumferential surface of the insertion groove (410) for screw connection and fixation therebetween. In addition, the support member (400) may be formed at the other end with a groove (420) to allow a user to more easily couple or separate the support member (400) therefrom. The groove (420) may be formed in a plural number at the other end of the support member (400), where any one groove (420) and an adjacent other groove (420) thereof may be spaced apart at a predetermined distance to a circumferential direction from each other.

For example, any one groove (420) may face any other symmetrical groove (420) on a circumference of the other end of the support member (400), where the groove (420) may be preferably formed in a plural number on the circumference, each groove (420) being spaced apart at a 90° distance. Hence, the user can couple or separate the support member (400) using a tool such as a screw driver. For information, the support member (400) is coupled to the fragmental piece (230) formed by passing through a portion of the substrate (320) and by being bent from the shield can (200) (see FIG. 3), such that the shield can (200) and the substrate assembly (300) can be coupled by the support member (400).

Furthermore, the support member (400) coupled to the fragmental piece (320) may be coupled by screw-connection with a rear body (500, described later). The rear body (500) may form an inner space by being coupled with the lens holder (110), and the substrate assembly (300) and the shield can (200) can be accommodated into the inner space through which a cable (no reference numeral) can pass, where the cable can electrically connect the substrate assembly (300) with an outside electrical device.

Furthermore, a sealing member (no reference numeral) may be arranged not only at a space between the rear body (500) and the lens holder (110), but also at an area where the cable pass through the rear body (500) in order to allow the inner space to be waterproof and moisture-proof.

Although the aforesaid explanations are simply exemplary embodiments to describe the camera module according to the present invention, the present invention is not limited thereto, and therefore, it should be understood that numerous other modifications and embodiments can be devised by those skilled in the art that will fall within the spirit and scope of the principles of this disclosure.

The invention claimed is:

1. A camera module, the camera module comprising:
   a lens part;
   a lens holder supporting the lens part while surrounding the same;
   a PCB assembly processing light input through the lens part into an electrical signal; and
   a shield can having an internal space in which the PCB assembly is disposed,
   wherein the PCB assembly comprises:
      a plurality of PCBs having circuits mounted thereon; and
      a flexible connecting part electrically connecting the plurality of PCBs and comprising a conductive layer in which a conductive material is disposed,
   wherein the shield can has an avoidance part formed in a position corresponding to the connecting part, and
   wherein the avoidance part of the shield can avoids interference with the connecting part of the PCB assembly.

2. The camera module of claim 1, wherein the conductive material in the conductive layer of the connecting part is formed in a mesh structure.

3. The camera module of claim 1, wherein a width of each conductive material forming the conductive layer is 55 µm to 165 µm.

4. The camera module of claim 1, wherein the conductive layer is such that a straight distance between nearest parallel conductive layers is 350 µm to 450 µm.

5. The camera module of claim 1, wherein the conductive layer further includes a conductive wire electrically connecting any one PCB and a PCB adjacent thereof.

6. The camera module of claim 1, wherein the plurality of PCBs includes a first PCB mounted at one surface with an image sensor converting a light incident from the lens part to an electrical signal, a third PCB receiving a power from an outside, and a second PCB interposed between the first PCB and the third PCB, wherein
the connecting part includes a first connecting part electrically connecting the first PCB and the third PCB, and a second connecting part electrically connecting the second PCB and the third PCB, and wherein
the shield can includes a first side opposite to one surface of the first connecting part, and a second side opposite to one surface of the second connecting part.

7. The camera module of claim 1, wherein the PCB assembly is supported to the shield can by a support member.

8. The camera module of claim 1, further comprising a rear body forming an inner space by being coupled to the lens holder,
wherein the shield can further includes, at an outer surface, an elastic part.

9. The camera module of claim 1, wherein the shield can includes a plurality of side walls and a rear wall, the PCB assembly being located between the lens holder and the rear wall.

10. The camera module of claim 1, wherein the shield can is connected to the lens holder such that at least the plurality of PCBs are enclosed between the lens holder and the shield can.

11. The camera module of claim 6, wherein the first PCB, the second PCB, and the third PCB are arranged in parallel, the first side is disposed between an imaginary plane defined by an upper surface of the second PCB and an imaginary plane defined by a bottom surface of the third PCB, and the second side is disposed between an imaginary plane defined by an upper surface of the first PCB and an imaginary plane defined by a bottom surface of the second PCB.

12. The camera module of claim 6, wherein a distance between the first side and the first connecting part and a distance between the second side and the second connecting part satisfy a scope greater than 0.1 mm but smaller than 0.9 mm.

13. The camera module of claim 7, wherein the support member includes, at one end, a plurality of grooves formed by being spaced apart by a predetermined distance along a circumferential direction.

14. The camera module of claim 7, wherein an outer circumferential surface of one end of any one support member is screw-connected to an inner circumferential surface of an insertion groove formed at another end of another support member using mutually corresponding screw threads.

15. The camera module of claim 9, wherein the plurality of side walls and the rear wall of the shield can define the internal space in which the PCB assembly is disposed.

16. The camera module of claim 11, wherein the first side is such that a nearest distance with the imaginary plane defined by the upper surface of the second PCB is shorter than the nearest distance with the imaginary plane defined by the bottom surface of the third PCB, and
wherein the second side is such that a nearest distance with the imaginary plane defined by the bottom surface of the second PCB is shorter than a nearest distance with the imaginary plane defined by the upper surface of the first PCB.

17. A camera module, the camera module comprising:
a lens part;
a lens holder supporting the lens part while surrounding the same;
a PCB assembly processing light input through the lens part into an electrical signal; and
a shield can having an internal space in which the PCB assembly is disposed,
wherein the PCB assembly comprises:
a plurality of PCBs having circuits mounted thereon; and
a flexible connecting part electrically connecting the plurality of PCBs and comprising a conductive layer in which a conductive material is disposed,
wherein the shield can has an avoidance part formed in a position corresponding to the connecting part, and
wherein each of the plurality of PCBs includes a first layer and a fourth layer mounted with parts, a second layer disposed between the first and fourth layers and printed with conductive material, and a third layer disposed between the second layer and the fourth layer including a circuit for transmitting an electrical signal, wherein the conductive layer of the connecting part is mutually conductive by being extended from the second layer of any one PCB and the second layer of an adjacent PCB thereof.

18. The camera module of claim 17, wherein the connecting part connects between PCBs, and further includes a signal connecting layer printed with a circuit for mutual conductivity by being extended from the third layer of one PCB and the third layer of an adjacent PCB thereof.

19. A camera module, the camera module comprising:
a lens part;
a lens holder supporting the lens part while surrounding the same;
a PCB assembly processing light input through the lens part into an electrical signal; and
a shield can having an internal space in which the PCB assembly is disposed,
wherein the PCB assembly comprises:
a plurality of PCBs having circuits mounted thereon; and
a flexible connecting part electrically connecting the plurality of PCBs and comprising a conductive layer in which a conductive material is disposed,
wherein the shield can has an avoidance part formed in a position corresponding to the connecting part, and
wherein the PCB assembly is supported to the shield can by a plural number of support members, each support member being formed with an insertion groove, and one end of any one support member is inserted into the insertion groove formed at another end of another support member.

20. A camera module, the camera module comprising:
a lens part;
a lens holder supporting the lens part while surrounding the same;
a PCB assembly processing light input through the lens part into an electrical signal;
a shield can having an internal space in which the PCB assembly is disposed; and
a rear body forming an inner space by being coupled to the lens holder
wherein the PCB assembly comprises:

a plurality of PCBs having circuits mounted thereon; and a flexible connecting part electrically connecting the plurality of PCBs and comprising a conductive layer in which a conductive material is disposed, wherein the shield can has an avoidance part formed in a position corresponding to the connecting part, and wherein the shield can includes, at an outer surface, an elastic part.

\* \* \* \* \*